United States Patent
Hata et al.

(10) Patent No.: US 8,269,301 B2
(45) Date of Patent: Sep. 18, 2012

(54) SUBMOUNT FOR OPTICAL DEVICE AND ITS MANUFACTURING METHOD

(75) Inventors: Shohei Hata, Yokohama (JP); Eiji Sakamoto, Yokohama (JP); Naoki Matsushima, Yokohama (JP); Hideaki Takemori, Hitachi (JP); Masatoshi Seki, Hitachi (JP)

(73) Assignee: Hitachi Kyowa Engineering Co., Ltd., Ibaraki (JP)

( * ) Notice: Subject to any disclaimer, the term of this patent is extended or adjusted under 35 U.S.C. 154(b) by 803 days.

(21) Appl. No.: 12/295,740

(22) PCT Filed: Apr. 4, 2007

(86) PCT No.: PCT/JP2007/057545
§ 371 (c)(1),
(2), (4) Date: May 8, 2009

(87) PCT Pub. No.: WO2007/119671
PCT Pub. Date: Oct. 25, 2007

(65) Prior Publication Data
US 2009/0219728 A1    Sep. 3, 2009

(30) Foreign Application Priority Data
Apr. 4, 2006   (JP) .................................. 2006-102978

(51) Int. Cl.
*H01L 31/0203* (2006.01)
*H01L 27/15* (2006.01)

(52) U.S. Cl. .......... 257/434; 257/81; 257/435; 257/436; 257/676; 257/680; 257/731

(58) Field of Classification Search .................... 257/81, 257/434, 435, 436, 676, 680, 731
See application file for complete search history.

(56) References Cited

U.S. PATENT DOCUMENTS

| | | | |
|---|---|---|---|
| 7,525,124 B2 * | 4/2009 | Takemori et al. ............... | 257/81 |
| 2005/0132747 A1 | 6/2005 | Takemori et al. | |
| 2005/0169570 A1 * | 8/2005 | Kim et al. ....................... | 385/14 |
| 2006/0049422 A1 | 3/2006 | Shoji | |
| 2007/0114555 A1 * | 5/2007 | Takemoto et al. .............. | 257/99 |

FOREIGN PATENT DOCUMENTS

| | | |
|---|---|---|
| CN | 1744335 | 3/2006 |
| JP | 06-343017 | 12/1994 |
| JP | 2005-183558 | 7/2005 |
| JP | 2005-216962 | 8/2005 |
| JP | 2006-073547 | 3/2006 |

* cited by examiner

*Primary Examiner* — Thanh V Pham
(74) *Attorney, Agent, or Firm* — Antonelli, Terry, Stout & Kraus, LLP.

(57) ABSTRACT

Submounts for mounting optical devices which have an excellent heat radiating property and can be formed in a wafer state in batch are provided.
A metallized electrode including optical device mounting parts and wiring parts is formed on a surface of a first substrate containing an insulating material as a main component, a through hole is formed in a glass substrate serving as a second substrate, the optical device mounting parts of the first substrate are aligned to be located inside the through hole of the second substrate, and the first substrate and the second substrate are joined together by use of a method such as anodic bonding.

12 Claims, 9 Drawing Sheets

SUBMOUNT FOR OPTICAL DEVICE AND ITS MANUFACTURING METHOD

FIELD OF THE INVENTION

The present invention relates to a structure of a submount and a manufacturing method thereof, and in particular, to a submount appropriate to mount a surface-emitting type of optical device such as a semiconductor light-emitting device thereon and to effectively focus light in a light emitting direction of the device, an optical module in which an optical device is mounted on a submount, and a manufacturing method thereof.

BACKGROUND OF THE INVENTION

With respect to a surface-emitting type of optical devices, in particular, LED (Light Emitting Diode), recently, the characteristics thereof have been improved, and expectations for usage expansion are high. According to the related art, an LED is mounted in a plastic case and a micro lens or the like is disposed in a light path to focus light. Alternatively, all of an LED and a substrate having the LED mounted thereon are molded in a transparent resin and the surface of the resin is shaped into a smooth sphere or the like such that the resin is used as a lens to focus light. Such light-emitting parts having LEDs have been used for electric bulletin boards, large-sized screens for films, lights of signaling apparatuses, illuminations, etc.

However, since LEDs consume a smaller amount of power and have a longer light-emitting lifetime as compared to conventional electric bulbs, their use has been taken into consideration for being applied to a wide range of illumination fields including electric lamps, interior illuminations, illuminations for automobiles, backlights for liquid crystal screens, etc.

Further, a technique relating to such a kind of submount is disclosed in Patent Publication 1, for example.

Patent Publication 1: Japanese Laid-Open (Unexamined Patent Application Publication) No. 2005-183558

In consideration of the above application for illumination fields, it is required to put a number of LEDs together on a plane, to make the LED emit light, and to focus the light. The reason comes from the fact that the intensity of light of one LED element is considerably weaker as compared to an electric bulb. Further, in the case of LED elements molded by use of a resin or the like according to the related art, there is a limitation in densely arranging LED elements.

Further, as an output of an LED element becomes brighter, the temperature of the LED element easily increases, while the luminous efficiency thereof easily decreases. Therefore, in order to apply LED elements to various fields including lights, illuminations, etc., it is required to densely arrange high-power LED elements and to effectively focus light.

In order to focus light, in general, lenses are used. However, if lenses are used for every LED element, the cost results in a rise in product price and supporting members are needed to fix the lenses over the LED elements.

Moreover, in order to manufacture inexpensive submounts for mounting optical devices, production rationalization such as manufacturing a lot of products with a wafer-shaped substrate in batch while reducing the materiel expense and processing cost is necessary.

SUMMARY OF THE INVENTION

According to embodiments of the present invention, in order to achieve the object, representative submounts as described below are provided. The following is provided below.

(1) A submount including a first substrate having optical device mounting parts for mounting optical devices and a wiring part for supplying power to the optical devices which are formed on a main surface thereof, and a second substrate composed of a glass substrate having a through hole formed therein, the first substrate and the second substrate joined together such that the optical device mounting parts of the first substrate are aligned inside the through hole of the second substrate, wherein the first substrate is composed of a substrate containing an insulating material as a main component, the wiring parts are a metallized electrode having first wiring parts supplying power to one electrode terminal of each of the optical devices mounted on the optical device mounting parts, and second wiring parts provided adjacent to the first wiring parts and supplying power to another electrode terminal of each of the optical devices, and the joining of the first substrate and the second substrate is performed by anodic bonding of a metallized joint provided in a region other than a region where the wiring part is exposed on the main surface of the first substrate; or (2) the submount according to (1), wherein the second substrate is composed of a laminated substrate obtained by joining a glass plate and a silicon plate and is aligned so that the optical device mounting parts provided on the first substrate are located inside the through hole provided in the laminated substrate, and a glass plate of the first substrate and the second substrate are joined together.

(3) Moreover, the metallized joint of the first substrate and the glass of the second substrate are jointed by anodic bonding, which makes it possible to join the first substrate and the second substrate together in a wafer state, and can contribute to rationalization of production of the submounts, as well as providing inexpensive submounts.

As described above, according to the present invention, optical devices represented by, for example, LEDs can be mounted in a high density, and it is possible to provide a submount for LEDs which can effectively focus light, has an improved heat radiating property, and is inexpensive, and an optical module in which optical devices are mounted on the submount. When LEDs generating red, green, and blue light components are combined, it is possible to synthesize the light components to generate white light or to control power of each optical device to change the color tone of light.

Moreover, it is possible to manufacture a submount by anodic bonding by using a substrate formed of glass or by jointing glass and silicon as a material of a substrate on which a light reflecting film has been formed. The anodic bonding is a technique suitable for joining wafers or plate-shaped objects and can reduce the manufacturing cost to provide an inexpensive submount.

BRIEF DESCRIPTION OF THE DRAWINGS

FIG. 6 is a cross sectional view illustrating a state in which power is supplied to the submount on which the optical devices of FIG. 5 have been mounted according to the first embodiment of the present invention such that the optical devices are turned on.

EXPLANATION OF REFERENCE NUMERALS AND SYMBOLS

Figure 1:
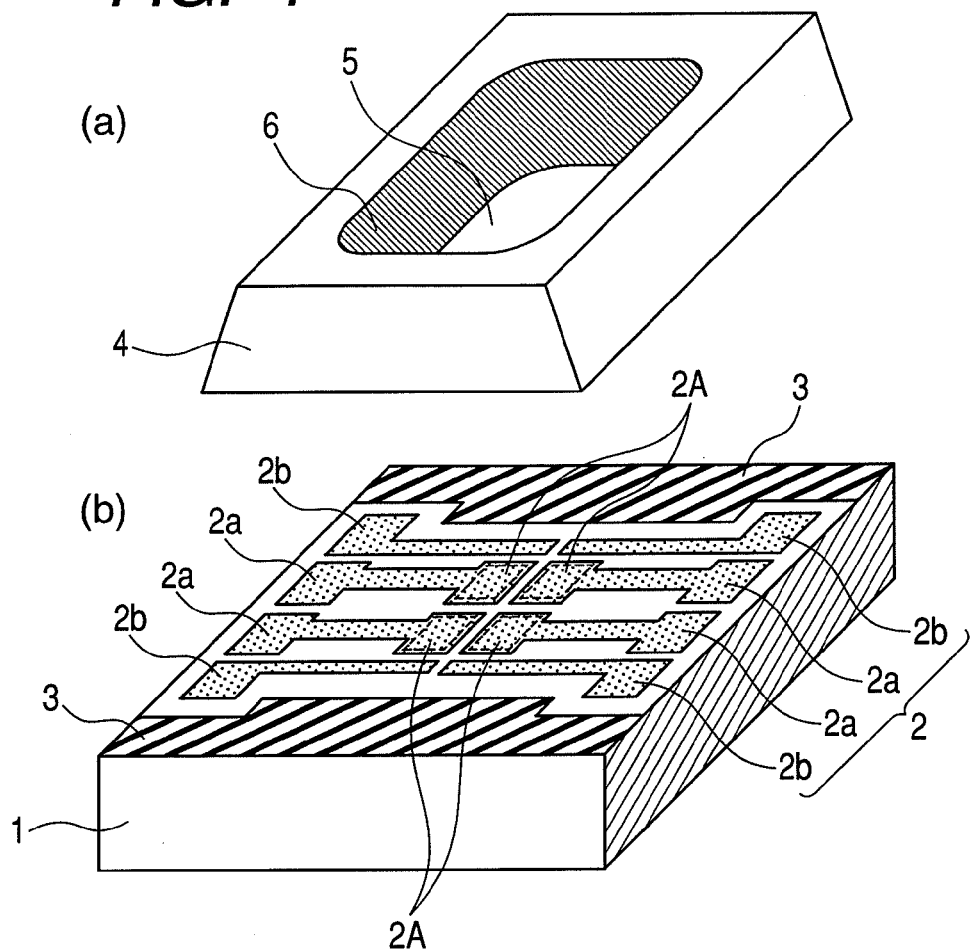
FIG. 1 is a perspective view of a first substrate and a second substrate constituting a submount according to a first embodiment of the present invention.

1 ... First substrate
2 ... Metallized electrode
2A ... Optical device mounting part
2a ... First wiring part formed in metallized electrode 2
2b ... Second wiring part formed in metallized electrode 2
2B ... Bottom surface metallized electrode
3 ... Metallized joint
4 ... Second substrate
5 ... Through hole
6 ... Reflective film
7 ... Optical device
8 ... Cementing material
9 ... Wire bonding
10 ... Through hole
10a ... Through hole connected to first wiring part
10b ... Through hole connected to second wiring part
11 ... Silicon
12 ... Glass
13 ... Glass plate
14a ... Cut position of joined substrates
14b ... Cut position of joined substrates

DETAILED DESCRIPTION OF THE PREFERRED EMBODIMENTS

Representative embodiments of the present invention will be described below in detail with reference to the drawings.

[First Embodiment]

A first embodiment of the present invention will be described with reference to FIGS. 1 to 6.

FIG. 1 shows an exploded view of minimum configuration unit portions of a submount according to the present invention for showing an image of a completed product after substrates have been processed, jointed, and cut. FIG. 1(a) shows a perspective view of a second substrate 4 before being jointed, and FIG. 1(b) shows a perspective view of a first substrate 1 before being jointed. Reference numeral 5 represents a through hole and reference numeral 6 represents a reflective film provided on the wall of the through hole.

Figure 2:
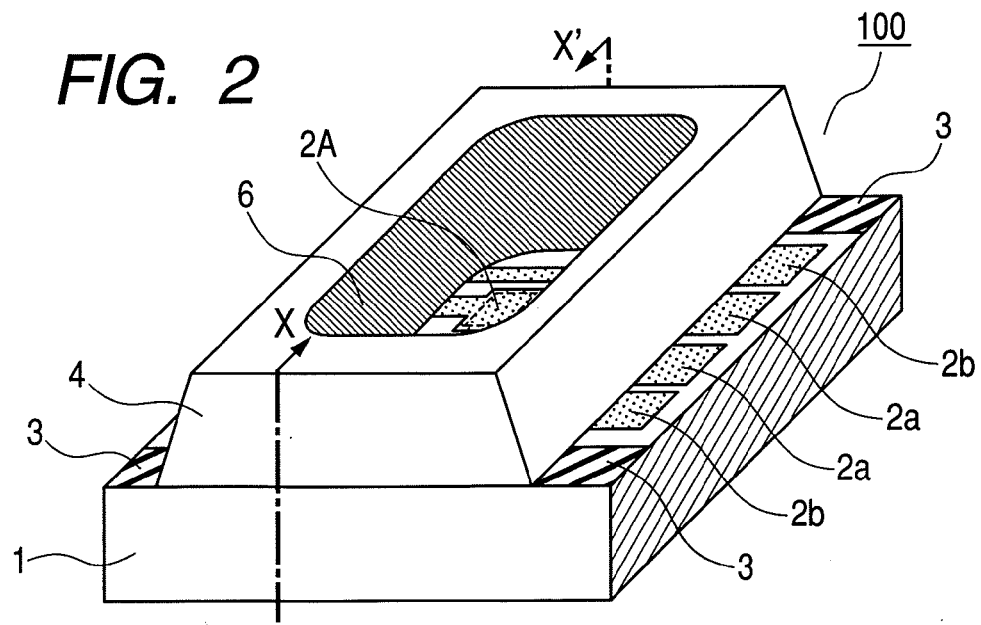
FIG. 2 is a perspective view of the submount according to the first embodiment of the present invention.

FIG. 2 is a perspective view of a submount 100 after a first substrate 1 and a second substrate 4 are aligned with each other and both substrates 1 and 4 are jointed. FIGS. 3(a) and 3(b) are top views illustrating the states of the substrates (wafers) 1 and 4 before aligning, respectively. FIG. 3(c) is a top view of the substrates after the substrates 1 and 4 are aligned and joined, where dotted lines show locations at which a jointed wafer is cut into minimum configuration unit portions of submounts.

Figure 4:
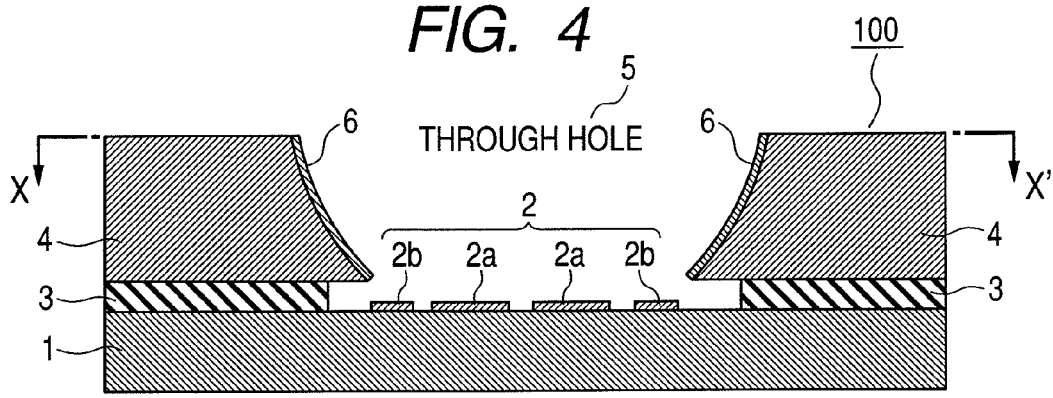
FIG. 4 is a cross sectional view of the first embodiment of the present invention taken along the line X-X' of FIG. 2.
Figure 5:
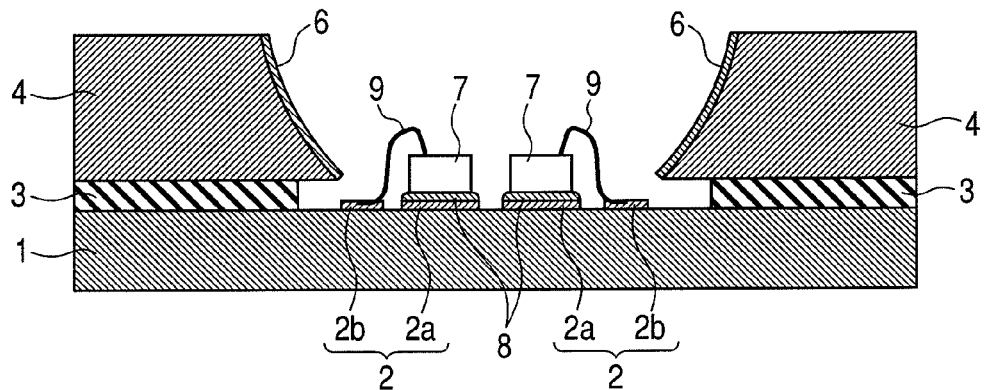
FIG. 5 is a cross sectional view illustrating a process of mounting optical devices on the submount of FIG. 4 according to the first embodiment of the present invention.
Figure 6:
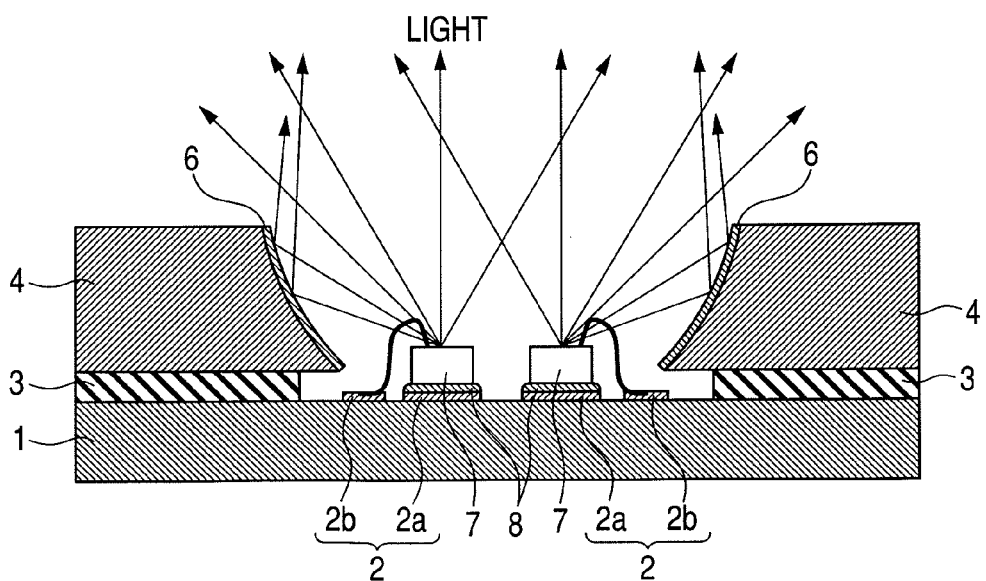

FIG. 4 is a cross sectional view of the submount 100 separated from the joined substrates as a minimum configuration unit portion by cutting (which corresponds to a cross section along the line X-X' of FIG. 2), FIG. 5 is a cross sectional view in a state in which optical devices 7 have been positioned (mounted) on optical device mounting parts 2A of the submount 100, and FIG. 6 is a cross sectional view illustrating a light emitting direction when power is supplied to the optical devices 7 mounted on the submount 100 of FIG. 5 through wiring parts 2 and the optical devices 7 emit light.

In the perspective views before joining of FIGS. 1(a) and 1(b), on the first substrate 1, the optical device mounting parts 2A, a metallized electrode 2, and a metallized joint 3 are formed. The metallized electrode 2 includes first wiring parts 2a for supplying power to one terminal of each of the optical devices mounted on the optical device mounting parts 2A, and second wiring parts 2b, which are adjacent to the first wiring parts 2a and electrically separated from the first wiring parts 2a for supplying power to the other terminal of each of the optical devices. The metallized joint 3 is made so that it is wider than the metallized electrode 2 and the height of the top surface of the metallized joint is higher than the metallized electrode 2. For practical purposes, it is preferable that the thickness difference between the metallized joint 3 and the metallized electrode 2 be at least 0.1 µm. If the metallized joint 3 is thicker than the metallized electrode 2, even though some unevenness exists in the surface of the pattern of the metallized electrode 2, since the height of the metallized joint 3 is higher than the metallized electrode 2, anodic bonding is securely performed.

A through hole 5 is formed in the second substrate 4, and a reflective film 6 is formed on the internal surface (wall) of the through hole 5.

Aligning is performed so that all of the optical device mounting parts 2A are accommodated in the through hole 5 of the second substrate 4. Moreover, joining is performed so that the metallized joint 3 on the first substrate 1 is directly pressed closely with the second substrate 4. In this embodiment, this joining is performed by anodic bonding, and may be performed with an adhesive or the like. Further, since the metallized electrode 2 is lower (thinner) than the metallized joint 3, it does not obstruct the joining. Below, the anodic bonding will be described in this embodiment.

Here, a material that composes each of the parts of the submount 100 will be described. A ceramic material that contains silicon carbide or aluminum nitride as a major component and has superior insulation property and a high degree of heat conductivity is suitable for the first substrate 1. When the calorific value of the optical devices 7 mounted on the submount of the present invention is small, not only the above-mentioned ceramic material but also a ceramic material that contains aluminum oxide, silicon nitride, etc. as a major component can be used.

A thin accumulating film of Ti/Pt/Au, which is formed by combining Ti for obtaining adhesiveness with ceramics, Pt for protecting Ti, and Au for preventing oxidation and improving connectivity with solder, is suitable for the metallized electrode 2. However, not only the above metal combination but also metallic thin films made of Ti/Ni/Au, Cr/Ni/Au, Ti/Cu, Cr/Cu, etc. can be used. The thickness of these metallic thin films is the same as the thickness of the whole of the metallized electrode 2 and is preferable to be 1 μm or less, for example, Ti (0.1 μm)/Pt (0.2 μm)/Au (0.2 to 0.5 μm).

A thin metal accumulating film of Ti/Au obtained by combining Ti and Al for obtaining adhesiveness with ceramics is suitable for the metallized joint 3. In the present invention, joining of the first substrate 1 and the second substrate 4 is often performed by the anodic bonding but is not limited thereto. In this case, the metallized joint obtained by combining Ti and Al is suitable for the anodic bonding. The reason will be described in the following explanation of anodic bonding. Moreover, the metallized joint 3 is a metallized joint obtained by joining with the second substrate and is called the metallized joint in the present invention. In this embodiment, the thickness of the metallized joint is Ti (0.1 μm)/Al (1 to 10 μm) and totally is 1 μm or more.

Borosilicate glass that is generally called Pyrex (is a registered trademark of heat-resistant glass) is suitable for the second substrate 4. The reason is that when silicon carbide ceramics is used for the first substrate 1 and the coefficient of thermal expansion thereof is generally $3.7 \times 10^{-6}$, if Pyrex glass having the coefficient of thermal expansion of $3.3 \times 10^{-6}$ is used for the first substrate, after joining, the difference in the thermal expansion results in less residual stress and reduces the possibility of breakage. Further, when another ceramic material is used for the first substrate, it is preferable that the glass has a coefficient of thermal expansion as close as possible to that of the ceramic material to be used for the second substrate.

As the material of the reflective film 6 formed on the internal surface of the through hole 5 of the second substrate 4, Ti/Al (the surface is formed of Al) is suitable. The reason is that Al has a characteristic for comparatively reflect various wavelengths uniformly. However, when it is acceptable to color reflected light, the configuration of the reflective film is not limited. The thickness of the reflective film is not particularly limited.

Next, the process for manufacturing each substrate will be described.

A metallic thin film such as Ti/Pt/Au is formed on the first substrate 1 by using a sputtering method, a vapor deposition method, etc. Next, the shape of the metallized electrode 2 which should be left is formed into a mask pattern of a photoresist by use of a photolithographic technique. Then, extra Ti/Pt/Au is removed by using a method such as milling. Subsequently, the mask pattern is removed by cleaning, etc.

The metallized joint 3 (Ti/Al) is also formed by use of a similar method. Moreover, in the pattern formation of such a metallized joint, not only the above-mentioned milling method but also methods such as an etching method using a special solution or a lift-off technique can be used. In the case of the lift-off technique, a photoresist pattern is formed in a portion other than a portion in which the pattern of the metallized joint will be formed, and the metallized joint is deposited thereon by use of sputtering, vapor deposition, etc. Then, extra metallized joint on the resist is removed and the resist is flushed with a solution, thereby forming the pattern.

In the processing the second substrate 4, first, a pattern of an opening of the through hole 5 by resist is formed. The pattern shape of the opening is a square shape with round corners in this embodiment, but may be a round shape or an ellipse shape. In other words, it is preferable that the design be performed according to the layout of the optical devices 7 and the intensity of focused light, which is similarly applied to the following embodiments.

Next, the substrate 4 is blasted with fine sand grains by using a sandblasting method to cut a portion of the substrate corresponding to the opening as shown in FIG. 4, thereby forming the through hole 5 having a surface sloping in the direction of the depth of the hole. According to the sandblasting method, the shape, sloping angle, and the like of the internal surface of the through hole 5 can be somewhat formed arbitrarily by controlling the material of the used sand grains, a grain size distribution, the flow velocity at which the sand grains are sprayed, etc., and thus light emitted from the optical devices 7 can be efficiently emitted to the outside.

Moreover, in the sandblasting method, even when the unevenness of the surface having been cut is large and the reflective film 6 is formed of Al or the like thereon, the unevenness may cause diffused reflection of light. In this case, in order to planarize the internal surface of the through hole, resin is applied as a base layer or a metallic thin film is formed on the internal surface of the through hole, and then grain growth is controlled and plating is performed, which makes it possible to reduce the unevenness in the internal surface of the through hole to some extent. Further, as described above with respect to the material of the reflective film 6, the unevenness can be sufficiently reduced by the plating film on the internal surface of the through hole 5, and if there is no problem in a light reflecting property, the plating film can substantially serve as the reflective film and thus it is possible to omit the process of forming the reflective film to be described below.

Next, in a state in which the portion of the substrate 4 other than the portion corresponding to the through hole 5 has been covered with the photoresist, the reflective film 6 (a metallic thin film such as Ti/Al) is formed by use of a sputtering method, a vapor deposition method, etc. In particular, when the film is provided from the large side of the opening of the through hole 5, it is thus formed evenly on the internal surface of the through hole. When the internal surface (wall) of the through hole 5 is coated with resin, plating, etc., if the reflecting property of the coating material is not sufficient, the reflective film 6 is formed thereon. Then, extra photoresist is flushed such that the reflective film 6 is left only on the internal surface of the through hole 5. Such a process is preferable in accordance to the light reflecting property required for designing the submount, which is similarly applied to the following embodiments.

Figure 3:
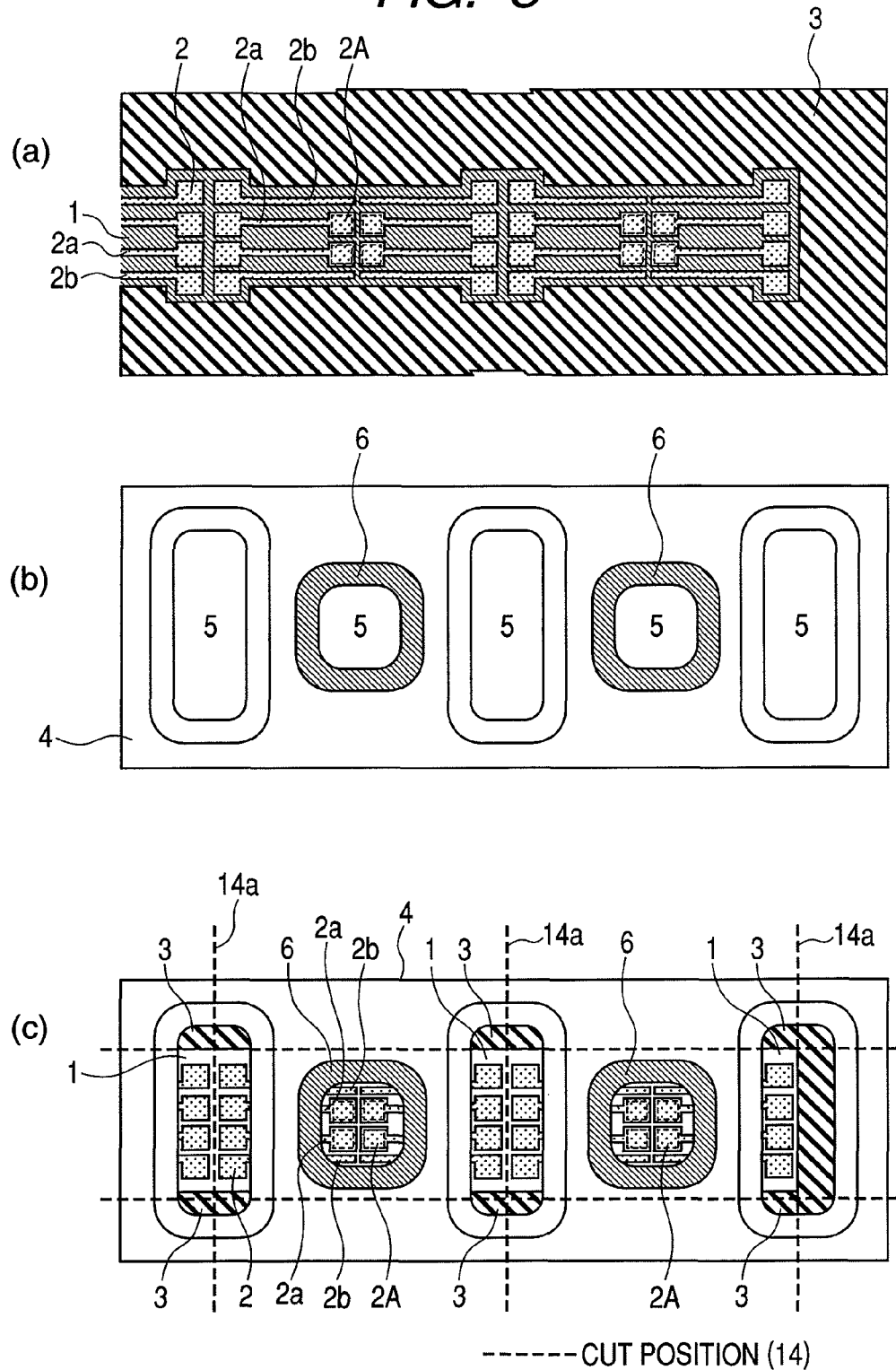
FIG. 3 is a plan view of a substrate illustrating a manufacturing process of the submount according to the first embodiment of the present invention.

The alignment, joining, and cutting of the first substrate 1 and the second substrate 4 will be described with reference to FIG. 3. FIGS. 3(a) and 3(b) show top views of the first substrate and the second substrate, respectively, and FIG. 3(c) schematically shows a plane view when the second substrate 4 after the alignment is viewed from the upper side.

First, in the alignment of substrates 1 and 4, the alignment is performed so that the optical device mounting parts 2A of the metallized electrode 2 are positioned inside the through hole 5 of the second substrate 4. Moreover, in this embodiment, a through hole is formed even in a portion of the second substrate 4 other than the portion corresponding to the portion where the optical devices are mounted so that a part of the wiring part of the metallized electrode 2 is positioned inside the through hole.

Next, the first substrate 1 and the second substrate 4 are joined by anodic bonding. The anodic bonding will be described hereinafter.

The anodic bonding is a technique that generally overlaps a glass substrate and a silicon substrate and directly joins them. Both are overlapped and heated to several hundreds of degrees. In this state, generally, a voltage is applied so that the glass side becomes negative and the silicon side becomes positive. It is said that as a result of the voltage application, a strong electric field is generated in the glass and positive ions having a small atomic radius, such as Na, contained in the glass are forcibly diffused to the negative electrode side due to the electric field, whereby a positive-ion depleted layer is formed in the glass substrate near the joint interface. The positive-ion depleted layer is charged negatively, and thus a stronger electrostatic attraction force is generated near the joint interface. This electrostatic attraction force strongly sticks the glass substrate and the silicon substrate. At the same time, oxygen contained in the glass substrate reacts with silicon contained in the silicon substrate to form oxide in the interface, thereby obtaining a strong chemical joint.

These inventors clarified, as a result of researching the anodic bonding technique, that not only anodic bonding of the glass substrate and the silicon substrate but also strong anodic bonding with a glass substrate by forming a metallized layer such as aluminum, titanium, etc. on a silicon substrate is possible. Moreover, it was found out that it is possible to perform anodic bonding of a glass substrate and a metallized layer on a ceramic substrate by forming a metallized layer of those metals on the ceramic substrate, overlapping the glass substrate thereon, and applying a high voltage to the glass substrate by energizing the metallized layer. The anodic bonding was generally a technique for joining a conductor, a semiconductor and glass. However, it was found out that an insulating material such as ceramics also can be joined by metallized layer formation, and the present invention was realized according to that research results.

The metallized joint 3 in this embodiment is formed to be wholly connected on the first substrate 1 to surround the outer circumference of a pattern group of the metallized electrode 2, as shown in FIG. 3(a). As a result, one probe is pressed against the outer part or the like of the first substrate 1 for energization, and at the same time, another probe is pressed against the top surface of the glass of the second substrate 4. In a state in which it is heated to about 400° C., a voltage of several hundreds of volts is applied such that the metallized joint 3 of the first substrate 1 substantially becomes equipotential, and thus a strong electric field is generated between the metallized joint and the another probe on the second substrate 4. As a result, anodic bonding is performed by that electric field.

Further, the surface of the metallized joint 3 formed on the first substrate 1 can be made of a metal such as zirconium, hafnium, tungsten, molybdenum, chromium, vanadium, magnesium, iron, etc, besides aluminum and titanium.

In the flowing process, the first and second substrates joined are cut at the positions represented by dotted lines 14a and 14b of FIG. 3(c). A perspective view and a cross sectional view of one of the submounts 100 which are separated from the substrates as minimum units by cutting are shown in FIGS. 2 and 4, respectively. Then, as shown in FIG. 5, the optical devices 7 such as LEDs are mounted on the optical device mounting parts 2A of the submount 100, one terminal of each of the optical devices 7 is connected to an optical device mounting part 2A of a wiring part 2a consisting of the metallized electrode 2 by using a cementing material (solder, a conductive adhesive, etc.), and the other terminal of each optical device is connected to a wiring part 2b consisting of the metallized electrode 2 provided adjacent thereto by wire bonding 9, whereby the optical devices 7 can obtain electrical connection.

Moreover, in order to further improve the productivity, it is possible to cut the submounts 100 serving as minimum units as shown in FIG. 3(c) after mounting the optical devices 7 and electrical connection are completed prior to the cutting of the joined substrates.

In the submount 100 where the optical devices 7 have been mounted in the above-mentioned manner, as shown in FIG. 6, a component of light horizontally emitted from the optical devices 7 is reflected from the reflective film 6 provided on the internal surface of the through hole 5 of the second substrate 4 to be focused to an upward and outward part. The optical devices 7 mounted on the submount 100 are not limited to optical devices emitting the same wavelength. For example, it is possible to generate white light or to arbitrarily control the color tone of light by combining various kinds of (red, green, blue, etc.) LED elements which have different wavelengths.

Further, in the submount 100 of this embodiment, four optical devices 7 are mounted. However, the number of optical devices mounted on the submount is not particularly limited but may be designed according to the usage. When a number of optical devices are mounted in a high density, or when a sufficient amount of light is obtained by one optical device, one optical device 7 may be mounted inside the through hole 5 of the submount. The number of mounted optical devices is similar in the following embodiments.

In the case of the submount of this embodiment having the mounted optical devices, it is used after the bottom surface of the first substrate 1 is connected on a printed substrate, a ceramic substrate, a metallic substrate, etc., by using a conductive adhesive, solder, etc. Electrical connection is performed by connecting onto the metallized electrode 2 (terminals of wiring parts 2a and 2b) existing in the outer circumference of the submount 100 by wire bonding, etc.

A light emitting product in which optical devices 7 are mounted on a submount 100 as described above can be applied to the all products that require light such as electric lamps, various signaling apparatuses, interior illuminations, illuminations for automobiles, backlights for liquid crystal screens, etc.

Moreover, in the case of a light emitting product obtained by combining and mounting three colors of, that is, red, green, and blue optical devices, it can also be applied to lights for illumination, lights for advertisement, etc., in addition to lights requiring white light, since it is possible to control the wavelength of synthesized light by changing the power of each of the optical devices.

When only optical devices of a specific wavelength are mounted, for example, when only red LEDs are mounted in a high density, it is considered the above can be applied to dryers and heating machines which irradiate strong red light and use radiant heat by light. Products to which the submount for mounting optical devices according to the present invention is applied are similar even in the following embodiments.

[Second Embodiment]

Figure 7:
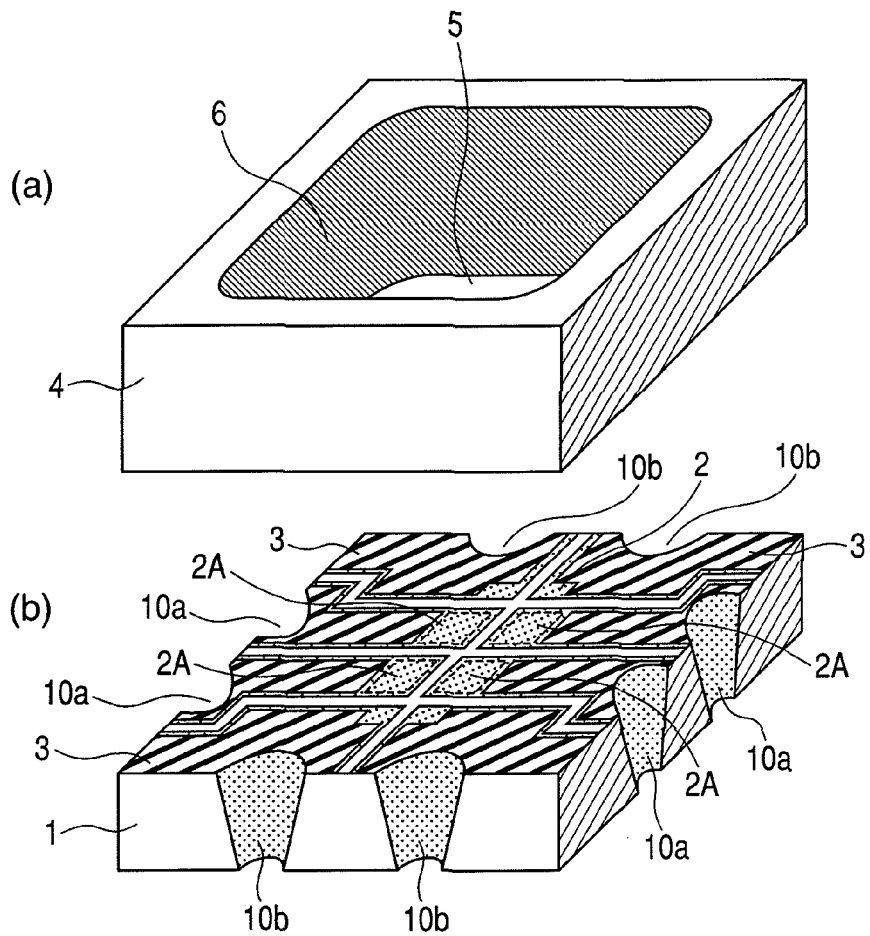
FIG. 7 is a perspective view of a first substrate and a second substrate constituting a submount according to a second embodiment of the present invention.

A second embodiment of the present invention will be described with reference to FIG. 7 which is an exploded view of a submount 100. Even in this embodiment, minimum configuration units of a submount are taken out and shown. In other words, FIG. 7(a) shows a second substrate 4 before joining, FIG. 7(b) shows a first substrate 1 before joining, and in an actual manufacturing process, it is possible to manufacture a batch of submounts by processing, joining, and cutting wafers or plate-shaped first and second substrates 1 and 4, similar to the first embodiment. This is similar even in the following embodiments.

As shown in FIG. 7(b), a resist pattern (not shown), in which a portion (which is in a semicircular shape as an image cut at the center of the hole in the drawing) to become a hole of a through hole 10 is hollowed, is formed at the outer circumference of a forming region of the optical device mounting parts 2A of the first substrate 1 formed of silicon carbide ceramics, etc., and the through hole is formed by using sandblasting, etc.

Next, the metallized electrode 2 is formed on the entire surface of the first substrate 1 by a sputtering method, etc., similar to the first embodiment. At this time, the metallized electrode is formed even in the through hole 10. A resist pattern is formed on the first substrate 1 again, and the metallized electrode 2 having the first wiring parts having the optical device mounting parts 2A, and the second wiring parts is formed by a milling method, etc., similar to the first embodiment, and then the metallized joint 3 is formed on the first substrate 1 by the same method.

Figure 8:
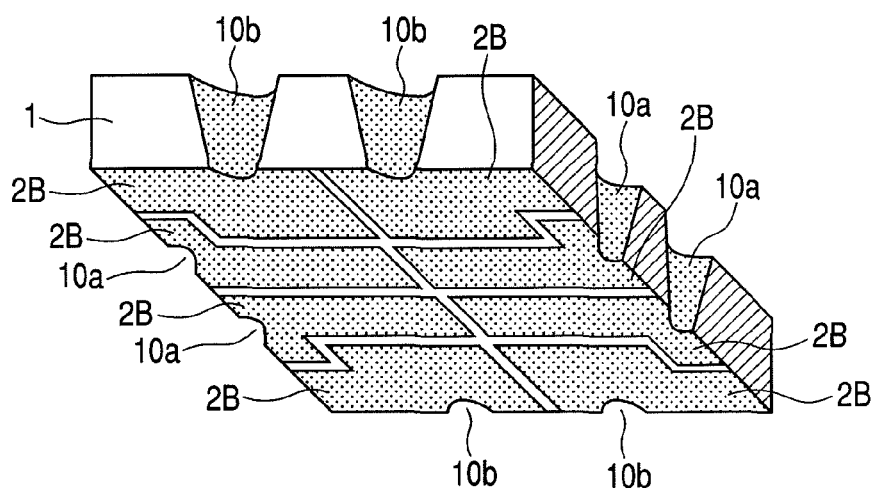
FIG. 8 is a perspective view illustrating a rear surface of the first substrate of the submount of FIG. 7 according to the second embodiment of the present invention.

In addition, as shown in FIG. 8, a bottom surface metallized electrode 2B is formed on the bottom surface of the first substrate 1 to be connected with each through hole 10.

Further, in the first substrate 1 shown in FIG. 7(b), the pattern shape of the metallized electrode 2 which includes the first wiring parts having the optical device mounting parts 2A, and the second wiring parts provided adjacent to the first wiring parts is substantially the same as the pattern of the bottom surface metallized electrode 2B of FIG. 8, one end part of each of the first and second wiring parts is independently connected to each through hole 10. Further, the pattern of the metallized joint 3 in this case is deposited on the metallized electrode 2 except for the optical device mounting parts 2A of the substrate surface and a portion of the second wiring parts facing the optical device mounting parts.

As shown in FIG. 7(a), a through hole 5 and a reflective film 6 are formed in the second substrate 4, similar to the first embodiment. Further, the materials of the substrate 4, the metallized electrode 2, the metallized joint 3, the reflective film 6, etc. are the same as those in the first embodiment.

Joining of the first substrate 1 and the second substrate 4 by the anodic bonding is performed after alignment is performed such that at least the optical device mounting parts 2A of the first substrate 1 are disposed inside the through hole 5 of the second substrate 4, and may be performed by used of a cementing material such as solder, an adhesive, etc., similar to the case of FIG. 3(c) of the first embodiment. In this embodiment, since Pyrex glass of the second substrate 4 and aluminum (Al) of the surface of the metallized joint 3 on the first substrate 1 are firmly joined due to the reaction of Al and oxygen in the glass by anodic bonding, anodic bonding is suitable for and applied to this structure.

At the time of anodic bonding, bonding is performed by bringing an anode of a joint device into contact with the bottom surface of the first substrate 1 and pressing a cathode of the joint device against the top surface of the second substrate 4. Conduction from the bottom surface metallized electrode 2B to the metallized electrode 2 on the top surface of the first substrate and the metallized joint 3 formed thereon through the metallized electrode on a side surface (the internal surface of the through hole 10) is established by applying a voltage to the electrodes of the joint device. As a result, a strong voltage is applied between the metallized joint 3 and the cathode of the joint device, that is, the second substrate 4, whereby the anodic bonding is performed.

Cutting of the joined substrates into submounts serving as minimum configuration units is performed at the centers of the through holes 10 arranged in vertical columns and horizontal rows located around the outer wall of the through hole 5 of the second substrate 4. The through hole 10 is originally a through hole formed in the first substrate (wafer) 1 but a half thereof by cutting is shown in the drawings. Through holes 10a in the drawings are connected to the first wiring parts having the optical device mounting parts 2A of the metallized electrode 2 and through holes 10b are connected to the second wiring parts.

Figure 9:
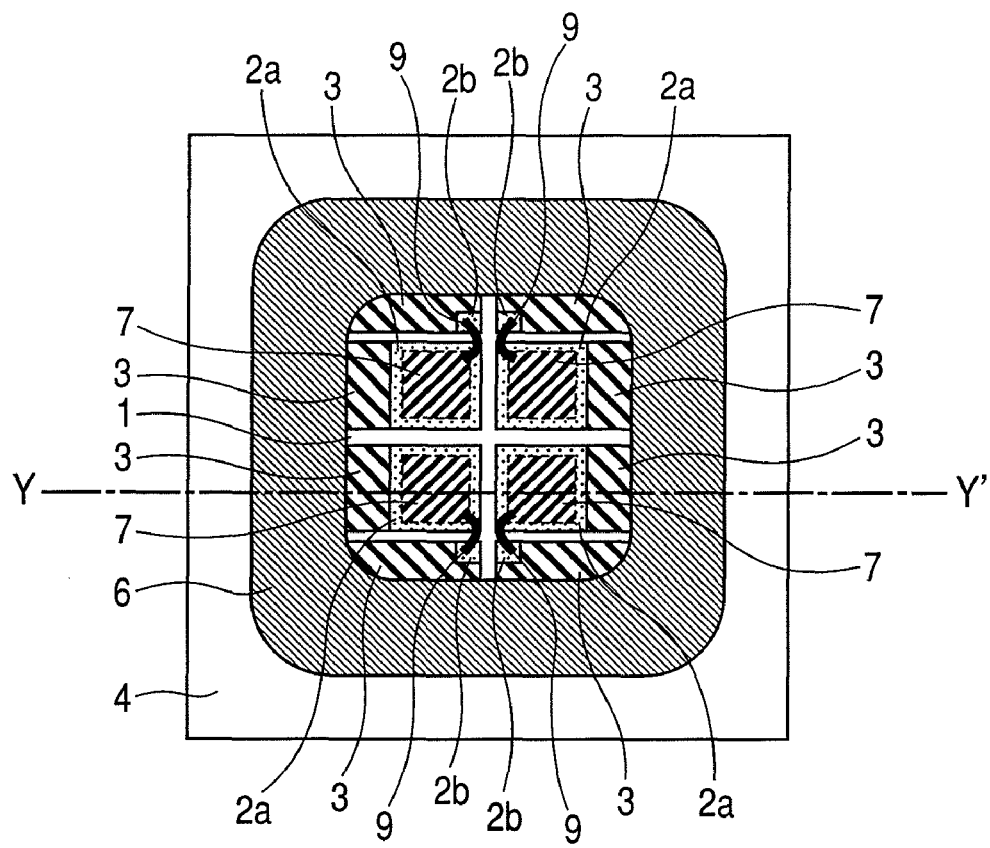
FIG. 9 is a plan view of a state in which the optical devices have been mounted on the submount of FIG. 7 according to the second embodiment of the present invention.
Figure 10:
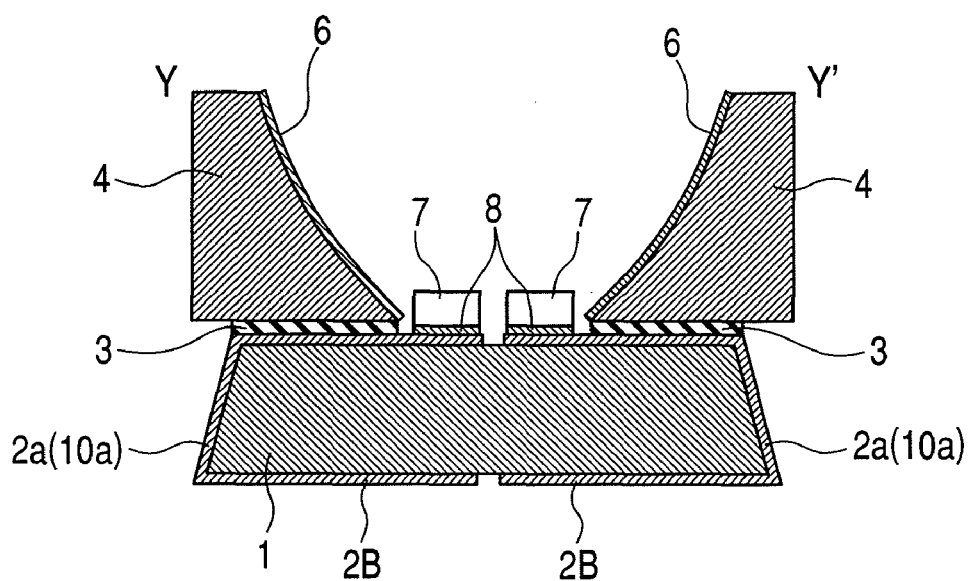
FIG. 10 is a cross sectional view of the second embodiment of the present invention taken along the line Y-Y' of FIG. 9.

FIG. 9 shows a top view in a state in which the optical devices 7 have been mounted on the submount 100 and FIG. 10 shows a cross sectional view taken along the line Y-Y' of FIG. 9. The optical devices 7 are mounted on the metallized electrode 2 (the optical device mounting parts on the first wiring parts 2a) by cementing material 8, and one electrode of each of the optical devices is connected to a first wiring part 2a. Examples of the cementing material 8 may include solder, a conductive adhesive, etc. Further, when the light emitting surfaces of the optical devices are the top surfaces, the other electrode of each of the optical devices is connected to a first wiring part 2b by wire bonding 9.

Moreover, according to the kinds of optical devices 7, the light emitting surfaces may be the bottom surfaces of the devices, and the positive and negative electrodes of the metallized electrode of each of the optical devices may also be on the bottom surface. In this case, the metallized electrode 2 on the first substrate 1 is designed to be matched to the electrodes of the optical devices and connection is obtained by solder, a conductive adhesive, etc. Further, when this submount is mounted on a circuit apparatus, it is used after the bottom surface metallized electrode 2B on the bottom surface of the first substrate 1 is connected on a printed substrate, a ceramic substrate, a metallic substrate where a circuit has been formed by an insulating part, etc., by solder, a conductive adhesive, etc. It is possible to improve a heat radiating property by connecting the wide area of the bottom surface of the first substrate 1 by solder, etc.

[Third Embodiment]

Figure 11:
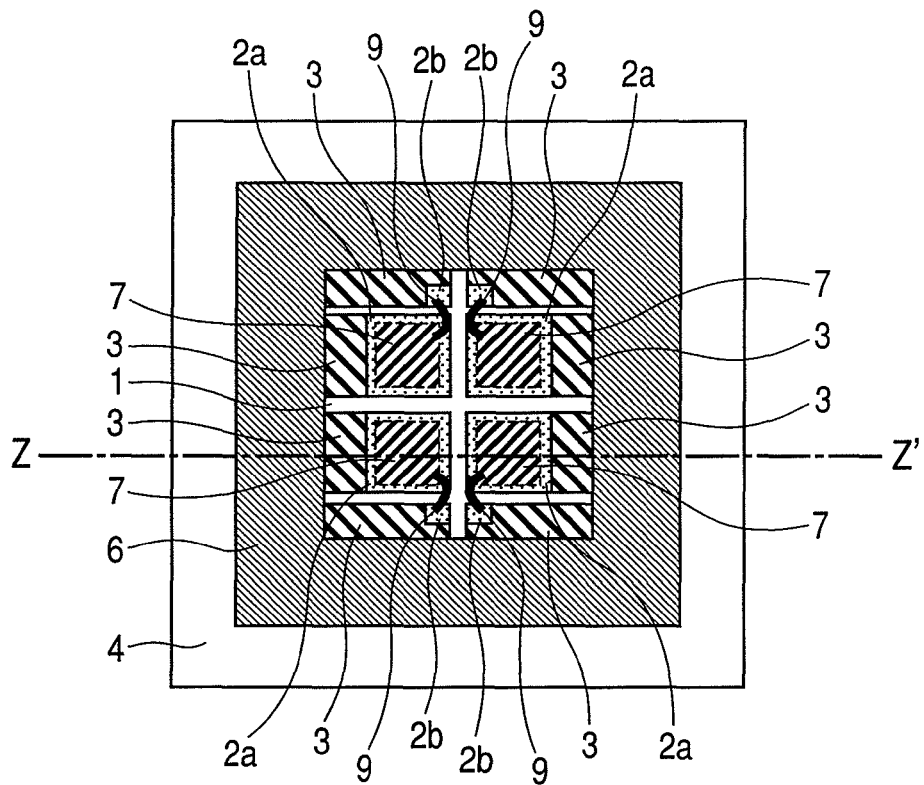
FIG. 11 is a plan view of a state in which the optical devices have been mounted on a submount according to a third embodiment of the present invention.

A third embodiment of the present invention will be described with reference to FIGS. 11 and 12. The manufacturing of the first substrate 1 is similar to that in the second embodiment, FIG. 11 corresponds to FIG. 9, and FIG. 12 is a cross sectional view taken along the line Z-Z' of FIG. 11 and corresponds to FIG. 10.

Figure 12:
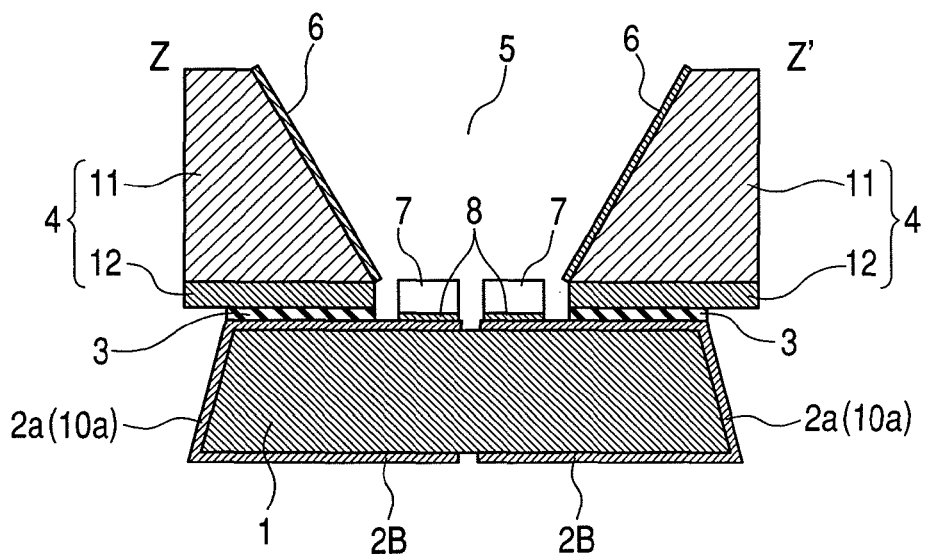
FIG. 12 is a cross sectional view of the third embodiment of the present invention taken along the line Z-Z' of FIG. 9.

As shown in FIG. 12, silicon 11 and Pyrex glass 12 are bonded to each other in advance by a method such as anodic bonding, which is used for the second substrate 4. In forming the through hole 5 in the silicon 11, it is possible to form a sloping surface of the wall of the hole as shown in the drawing by using a wet etching technique which is being used for manufacturing semiconductor devices.

First, a mask is formed on a silicon wafer in which the (100) plane becomes a surface by a photolithographic technique. The mask is made so that an etched part becomes an opening. If this is soaked in an etching solution of an appropriate concentration, an etching rate in the (111) plane which is a close-packed plane of the silicon is slow, and a hole through which the (111) plane appears on the surface is formed. The (111) plane forms a slope of 54.7 degrees with respect to the (100) plane, as shown in the drawing. The Pyrex glass 12 serving as the base remains without being etched but it is possible to etch the Pyrex glass of the bottom surface of the hole of the silicon by covering a rear surface with a mask and etching the glass with a fluorinated acid, etc., thereby forming the through hole 5. Subsequently, the reflective film 6 is formed.

Next, similar to the second embodiment, alignment of the first substrate 1 and the second substrate 4 is performed, the second substrate is brought into contact with the metallized joint 3 on the first substrate and is fixed using a jig, etc., the cathode of the joint device is pressed against the silicon 11, and anodic bonding is performed. A voltage is intensively applied to the Pyrex glass 11, so as to generate anodic bonding. Finally, the optical devices 7 are mounted, connection is made by the wire bonding 9, and power is supplied to the optical devices 7.

[Fourth Embodiment]

A fourth embodiment of the present invention will be described with reference to FIGS. 13 and 15. A substrate to be used, a material of a metallized layer, a manufacturing process, etc. are similar to those in the above-mentioned embodiments.

Figure 13:
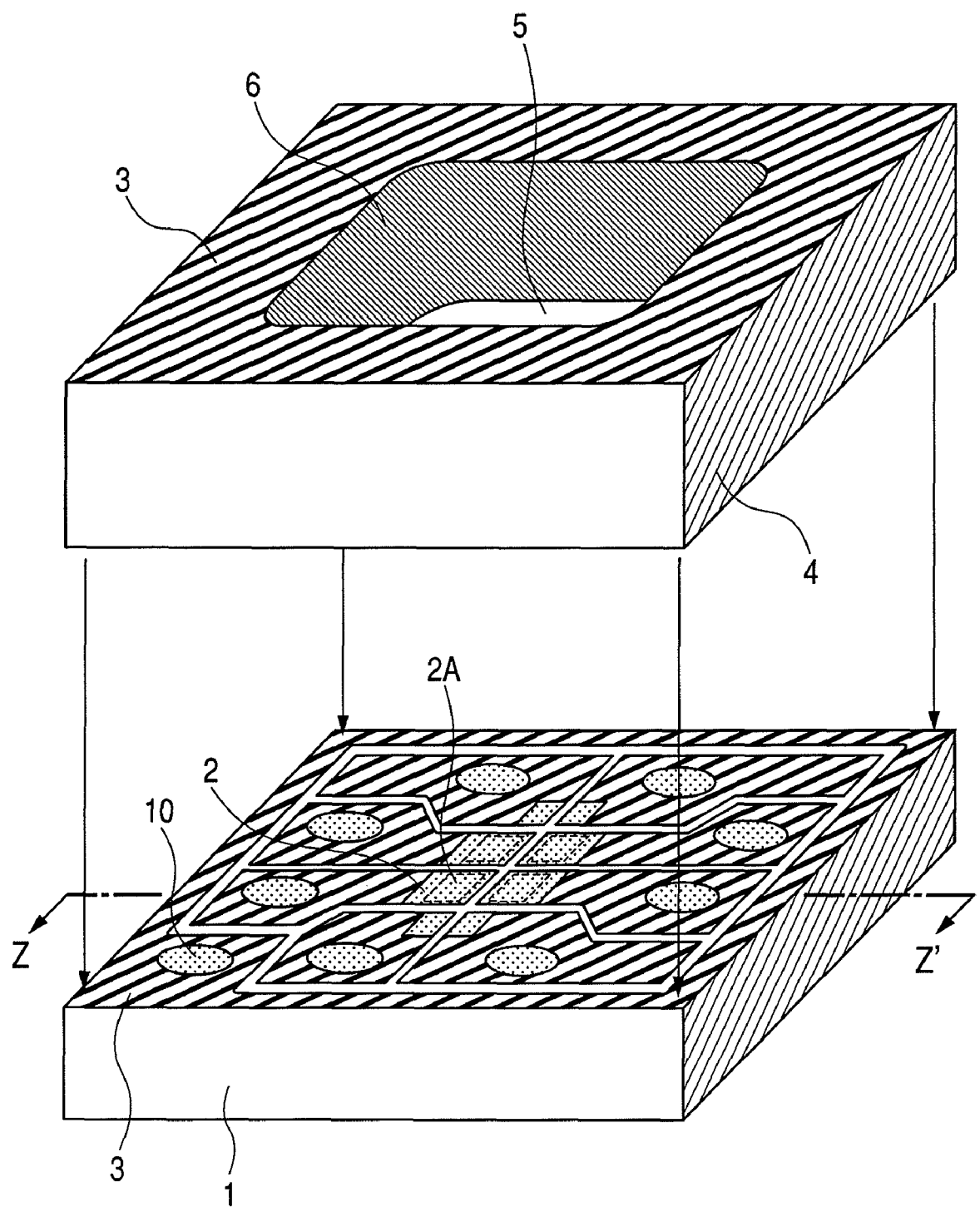
FIG. 13 is a perspective view of a first substrate and a second substrate constituting a submount according to a fourth embodiment of the present invention.

The features of this embodiment is to perform electrical connection between the top surface of the first substrate 1 and the bottom surface by the metallized electrode 2 in the through hole 10, and to form the metallized electrode 2 and the metallized joint 3 for purposes different from the power supply to the optical devices around the metallized electrode 2 of the optical devices 7, as shown in FIG. 13. By such a structure, the second substrate 4 and the metallized joint 3 are joined together, the optical devices 7 are mounted, and finally, the glass plate 13 and the metallized joint 3 formed on the top surface of the second substrate 4 are joined, thereby capable of sealing the optical devices 7 inside the submount 100.

The reason will be described below. External air permeating to the optical device mounting parts 2A through the through hole 10 is suppressed by joining the metallized joint 3 around the through hole 10 and the second substrate 4. However, external air which permeates from a part where the metallized joint does not exist, that is, a part where the first substrate is exposed cannot be prevented, but is prevented by the metallized joint 3 disposed the outermost circumference.

Figure 14:
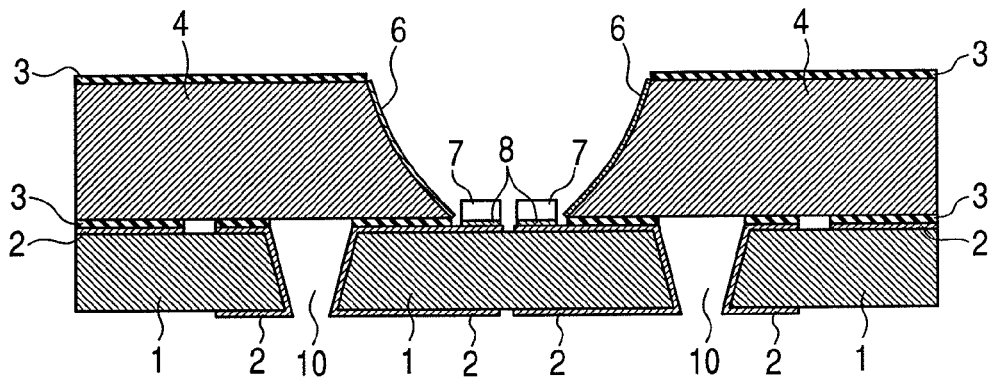
FIG. 14 is a cross sectional view illustrating a state in which optical devices have been mounted on the submount of FIG. 13 according to the fourth embodiment of the present invention and taken along the line Z-Z' of FIG. 13.
Figure 15:
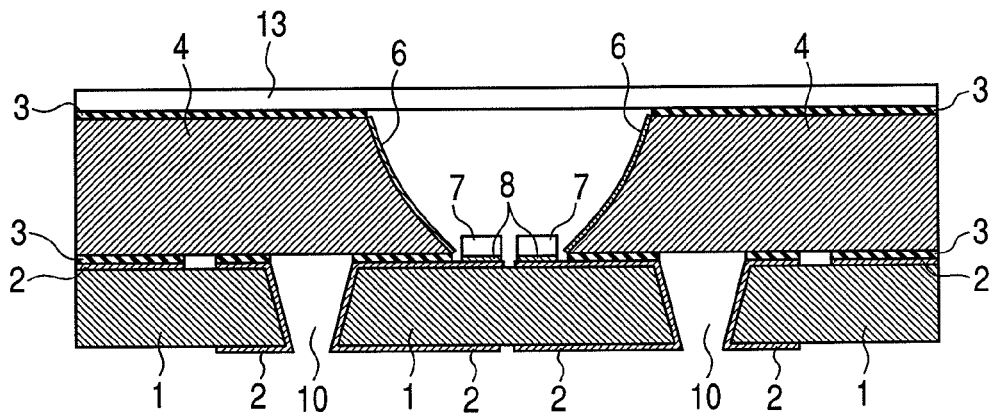
FIG. 15 is a cross sectional view illustrating a state in which the top surface of the submount of FIG. 14 according to the fourth embodiment of the present invention has been sealed by a glass plate 13.

After the optical devices 7 are mounted, as shown in FIG. 15, a glass plate 13 such as Pyrex glass is pressed onto the metallized joint 3 (FIG. 14) which has been formed already on the second substrate 4, and joining is performed. The anodic bonding can be applied to the joining at this time. At this time, there is a concern that the optical devices may become damaged by voltage application. However, it is possible to prevent a voltage from being applied to the optical devices by short-circuiting the positive and negative metallized electrode 2 connected to the optical devices by using portions cut in the following cutting process, for example.

In the above-mentioned manner, a module in which the optical devices suppressing external air from permeating in addition to the effect having been described so far have been mounted is completed. This module is suitable for use under severe environment, for example, when corrosive external air exists.

In this embodiment, when a module including optical devices suppressing permeation of external air and mounted therein is formed, a glass plate 13 such as Pyrex glass is formed on the second substrate 4 to suppress external air from permeating to the optical device mounting parts 2A. The Pyrex glass can be replaced with another material that penetrates light from light emitting devices.

[Fifth Embodiment]

Figure 16:
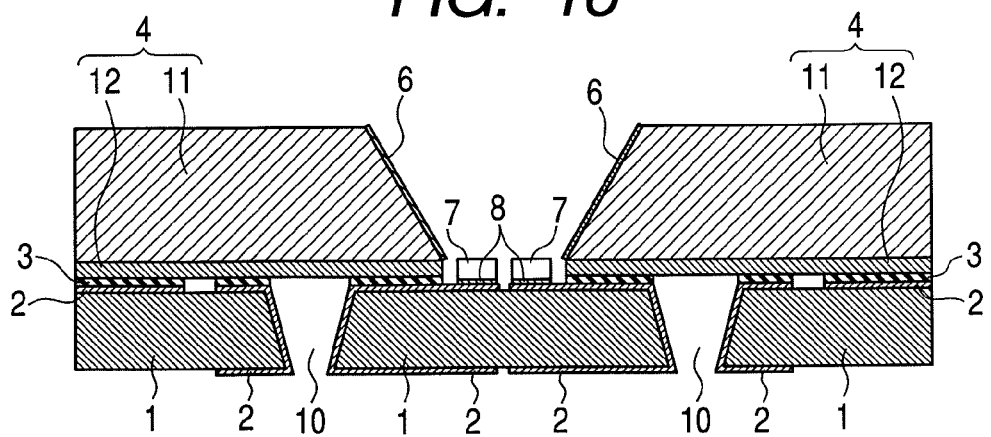
FIG. 16 is a cross sectional view illustrating a state in which optical devices have been mounted on a submount according to a fifth embodiment of the present invention.
Figure 17:
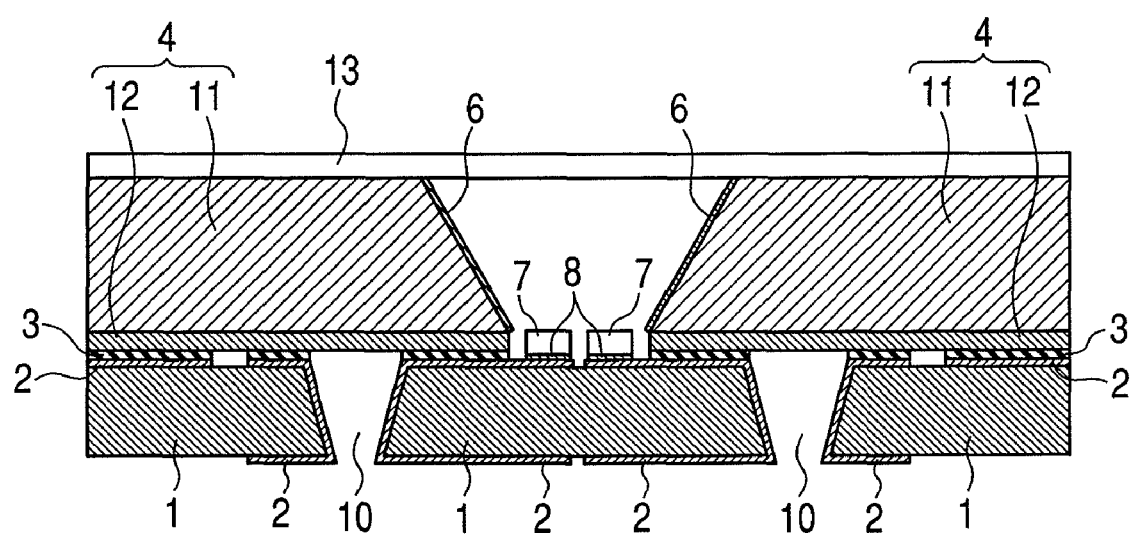
FIG. 17 is a cross sectional view illustrating a state in which the top surface of the submount of FIG. 16 according to the fifth embodiment of the present invention has been sealed by a glass plate 13.

A fifth embodiment of the present invention will be described with reference to FIGS. 16 and 17. A submount 100 of this embodiment also has a structure suppressing external air from permeating, similar to the fourth embodiment, and a substrate obtained by bonding silicon and Pyrex glass is used as the second substrate 4, as in the third embodiment.

The optical devices 7 are mounted on the optical device mounting parts of the submount, one electrode terminal of each of the optical devices is connected to a first wiring part of the metallized electrode 2 by the cementing material 8, the other electrode terminal is electrically connected to a second wiring part by wire bonding, and the glass plate 13 is joined on the silicon 11. The anodic bonding is suitable for this joining but the joining may be performed by an adhesive, solder, etc. Further, it is possible to form the metallized joint 3 on the silicon 11 in advance to improve the joining property.

Industrial Applicability

The present invention relates to a submount for mounting LED elements and can be applied to various lighting apparatuses, lights of signaling apparatuses, electric bulletin boards, backlights of liquid crystal screens, etc. Moreover, since permeation of external air is suppressed, the submount can be used under a severe environment such as a corrosive environment. When optical devices emitting red or infrared light are mounted, there is a possibility that the submount can be used for heating machines, dryers, and so on using the radiant heat of light. Further, when optical devices emitting blue or ultraviolet light are mounted, application of the present invention to lamps of an apparatus for exposing a photosensitive resist in a photolithographic technique, lamps for sunburn, etc can be considered.

What is claimed is:

1. A submount including a first substrate having optical device mounting parts for mounting optical devices and a wiring part for supplying power to the optical devices which are formed on a main surface thereof, and a second substrate composed of a glass substrate having a through hole formed therein, the first substrate and the second substrate joined together such that the optical device mounting parts of the first substrate are aligned inside the through hole of the second substrate, wherein the first substrate is composed of a substrate containing an insulating material as a main component, the wiring parts are a metallized electrode having first wiring parts supplying power to one electrode terminal of each of the optical devices mounted on the optical device mounting parts, and second wiring parts provided adjacent to the first wiring parts and supplying power to another electrode terminal of each of the optical devices, and an anodic bond of a metallized joint for joining the first substrate and the second substrate provided in a region other than a region where the wiring part is exposed on the main surface of the first substrate.

2. The submount according to claim 1, wherein on the main surface of the first substrate, the metallized joint is electrically separated from the wiring parts, is provided adjacent to the wiring part with a gap interposed therebetween, and extends in an outer circumference of the first substrate.

3. The submount according to claim 1, wherein on the main surface of the first substrate, the metallized joint is provided without overlapping any one of the wiring parts.

4. The submount according to claim 1, wherein the second substrate is composed of a laminated substrate formed by joining a glass plate and a silicon plate and is aligned so that the optical device mounting parts provided on the first substrate are located inside a through hole provided in the laminated substrate, and a glass plate of the first substrate and the second substrate are joined together.

5. The submount according to any one of claims 1 to 4, wherein a bottom surface metallized electrode is formed on a surface, opposite to a surface where a metallized electrode constituting the wiring parts is formed, of the first substrate, and the metallized electrode and the bottom surface metallized electrode are electrically connected to each other through a through hole.

6. The submount according to any one of claims 1 to 4, wherein a bottom surface metallized electrode is formed on a surface, opposite to a surface where a metallized electrode constituting the wiring parts is formed, of the first substrate, and the metallized electrode and the bottom surface metallized electrode are electrically connected to each other by a metallized layer process on a surface on a side of the first substrate.

7. The submount according to any one of claims 1 to 4, wherein an outermost surface of a metallized joint formed on the first substrate is at least one kind of metal selected from a group including aluminum, titanium, zirconium, hafnium, tungsten, molybdenum, chromium, vanadium, magnesium, and iron.

8. The submount according to any one of claims 1 to 4, wherein the first substrate is formed of a ceramic material containing at least one kind of silicon carbide, silicone nitride, aluminum nitride, and aluminum oxide as a main component.

9. The submount according to any one of claims 1 to 4, wherein a member penetrating light of the optical devices mounted on the optical device mounting parts is joined on a top surface of the second substrate so as to suppress external air from permeating into a through hole of the second substrate.

10. The submount according to any one of claims 1 to 4, wherein a planarized or smooth curved surface is formed on an internal surface of a through hole of the second substrate by forming a resin film or plating.

11. The submount according to any one of claims 1 to 4, wherein a light reflecting film is formed on an internal surface of a through hole of the second substrate.

12. An optical module comprising:
optical devices mounted on the optical device mounting parts of the submount according to any one of claims 1 to 4.

* * * * *